United States Patent [19]

Tokitsu et al.

[11] 4,449,206
[45] May 15, 1984

[54] PORTABLE MEMORY DEVICE

[75] Inventors: Naoki Tokitsu, Chiryu; Toshihiko Itoh, Nagoya; Toshitaka Fujiwara, Toyota, all of Japan

[73] Assignee: Nippondenso Co., Ltd., Kariya, Japan

[21] Appl. No.: 327,612

[22] Filed: Dec. 4, 1981

[30] Foreign Application Priority Data

Dec. 9, 1980 [JP] Japan .................. 55-174052

[51] Int. Cl.³ .............................................. G11C 7/00
[52] U.S. Cl. .................... 365/229; 340/870.29; 455/606
[58] Field of Search ............... 365/64, 215, 229, 234, 365/244; 455/606, 607, 612; 340/870.02, 870.29

[56] References Cited

U.S. PATENT DOCUMENTS

| | | | |
|---|---|---|---|
| 3,980,935 | 9/1976 | Worst | 365/229 |
| 4,044,339 | 8/1977 | Berg | 365/240 |
| 4,213,119 | 7/1980 | Ward et al. | 455/606 X |
| 4,298,839 | 11/1981 | Johnston | 455/602 X |

*Primary Examiner*—Joseph A. Popek
*Attorney, Agent, or Firm*—Cushman, Darby & Cushman

[57] ABSTRACT

A small portable memory device has optical connectors except for those connecting with an external power source. The memory device incorporates a semiconductor memory and information such as address and data information are applied externally by means of light beams. The light signals applied to the device are converted into electrical signals by phototransistors and the address and data information applied externally, one bit at a time, are temporarily stored in a shift register incorporated in the device. When the received input attains a predetermined number of bits, the semiconductor memory is accessed to effect the writing or reading of data. When reading the data, electrical signals indicative of the data to be read are converted into light signals by a light-emitting diode and are delivered from the device in the form of light signal.

5 Claims, 13 Drawing Figures

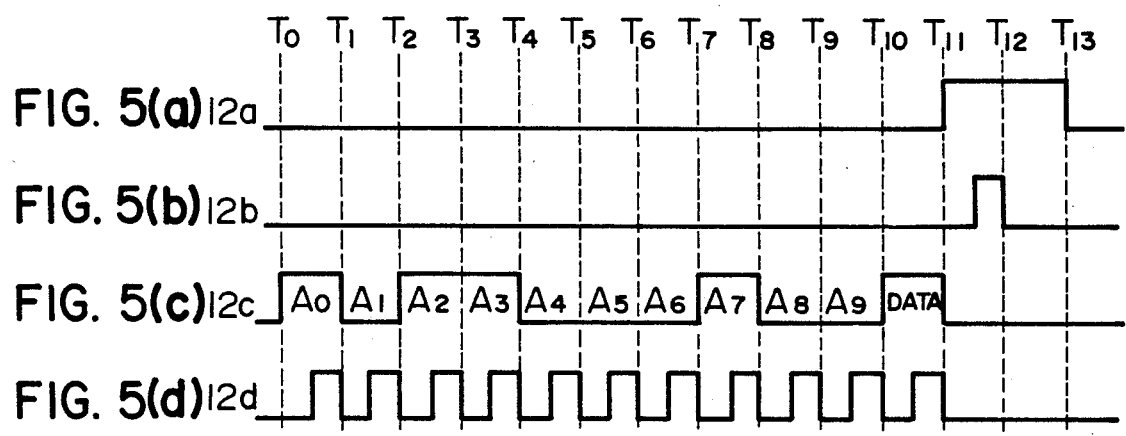
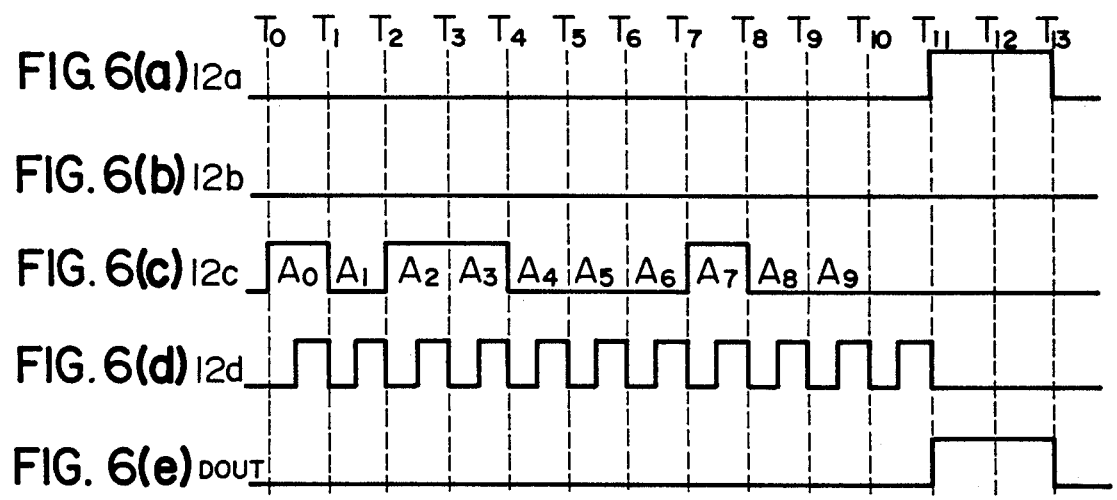

PORTABLE MEMORY DEVICE

BACKGROUND OF THE INVENTION

The present invention relates to a small, portable memory device which has no conductive coupling means for external connection other than those for connection to a power source.

Conventional storage mediums which are portable and which permit writing and reading of data are generally those of the magnetic type such as magnetic tapes, cassette tapes, magnetic disks and floppy disks. This type of storage medium is advantageous in that the reading and writing of data is simple, the record is non-volatile and so on.

However, this type of storage medium requires the use of a dedicated apparatus of complicated mechanism for reading and writing purposes. Thus, the system inevitably becomes bulky and expensive and the range of applications are limited as a result.

Another magnetic storage medium is a magnetic card. Magnetic cards have come into wide use recently. The magnetic card overcomes the foregoing disadvantages and is convenient for carrying by a person. However, since a magnetic recording is used, either the card or the magnetic head must be moved during the read and write operations. A driving system for this purpose is required. The durability of the driving system, and the durability of the magnetic cards themselves can present a problem. Further, since the read or write speed is limited by the mechanism, there is a fatal barrier to an increase in the storage capacity.

In order to overcome these deficiencies, memory devices have also been developed in which a semiconductor memory is contained in a case incorporating a back-up battery. Many of these devices use a conductive connector for connection with the main apparatus, thus giving rise to a reliability problem due to frequent connection and disconnection. Moreover, these devices are generally large in size so that the devices are not as easily portable as the previously mentioned magnetic cards, and their range of applications is limited.

SUMMARY OF THE INVENTION

With a view to overcoming the foregoing deficiencies in the prior art, it is the principal object of the invention to provide a portable memory device in which a direct conductive coupling with a main apparatus is made only to connect the power supply. The necessary signals for reading and writing data into a semiconductor memory are indirectly coupled in the form of light or sound wave signals or the like. A shift register is provided internally to temporarily store address information and write data, thereby minimizing the number of indirect junction points, reducing the size of the device, improving the device in durability and reliability and ensuring high-speed read and write operations.

BRIEF DESCRIPTION OF THE DRAWINGS

FIGS. 5(a)-5(d) and 6(a)-6(e) are timing charts which depict the processes for writing data to and reading data from the IC memory.

DESCRIPTION OF PREFERRED EMBODIMENT

Figure 1:
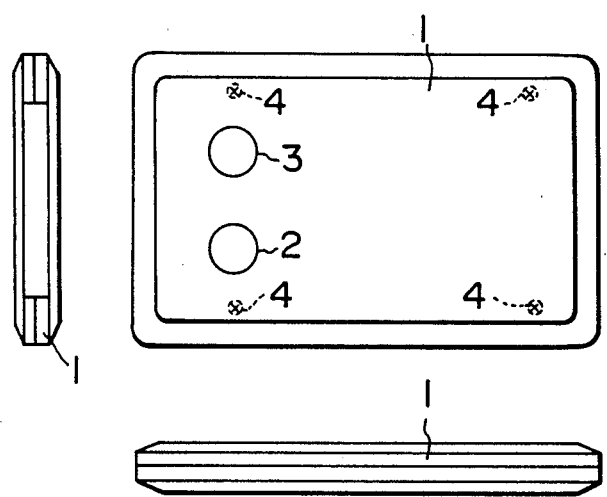
FIG. 1 shows three external sides of a presently preferred exemplary embodiment of the present invention.

A preferred embodiment of this invention will now be described. Referring to FIG. 1, three external sides of a memory device M in accordance with the present invention are shown. A case 1 is made from a synthetic resin material. Power supply electrodes 2 and 3 are arranged in the upper part of the case 1. The entire size of memory device M is on the order of a conventional magnetic card so as to make it portable.

Figure 2:
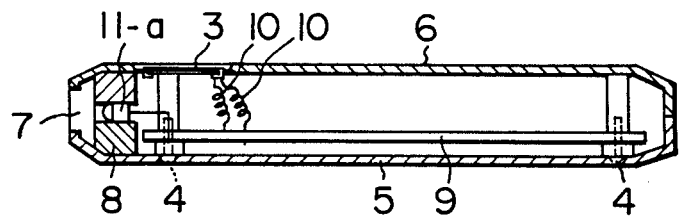
FIG. 2 is a sectional view showing the internal construction of a preferred exemplary embodiment.

Referring to FIG. 2, a sectional view of the memory device M is shown. A printed circuit board 9, disposed inside the memory device M, is held between a lower case 5 and an upper case 6 and fixed in place with four small screws 4.

In order to provide the necessary power supply to the printed circuit board 9, the previously mentioned electrodes 2 and 3 (the electrode 2 is not shown) are exposed to the outside and have one end bent inward of the upper case 6. Electrodes 2 and 3 are connected to the power supply terminals of the printed circuit board 9 by means of two lead wires 10. Four phototransistors 11-$a$ soldered onto the printed circuit board 9 form a light sensing unit 11 (only one of the phototransistors is shown. Although not shown), photodiodes are arranged in the same manner such that their forward ends are arranged to correspond with the phototransistors.

A window 7 comprises a filter which is transparent or of a color that passes infrared radiations, thus making it possible to carry out optical transmission through the window 7.

A holder 8 positions the light sensing unit 11 and a light emitting unit 16 such that the optical axes of their photo elements are all arranged at a right angle to the window 7.

Figure 3:
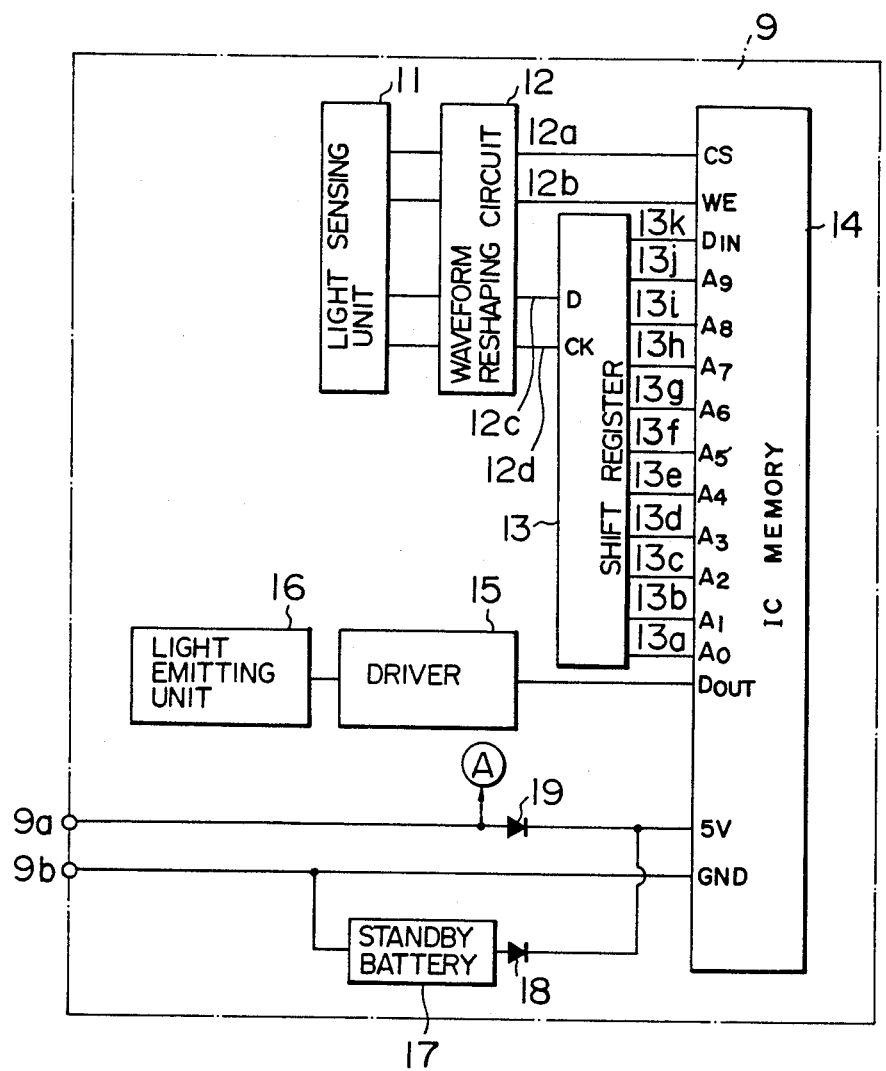
FIG. 3 is a block diagram showing the electric circuitry of the embodiment.

Referring to FIG. 3, shown is a block diagram of the internal construction of a printed circuit board 9. The entire circuitry of this device and a standby battery are mounted on printed circuit board 9. The components on the printed circuit board 9 are not shown in FIG. 2.

Figure 4:
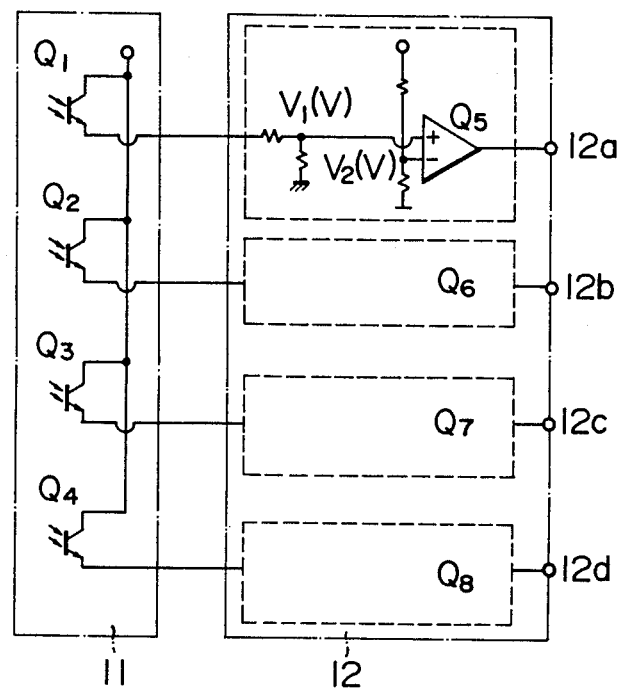
FIG. 4 is a circuit diagram of the converting circuit.

Referring to FIG. 3, light sensing unit 11 comprises the four phototransistors 11-$a$, which are arranged in a relation determined with reference to a main apparatus. (The details are shown in FIG. 4.)

A waveform reshaping circuit 12 reshapes the outputs of the phototransistors and converts them into logic levels of 0 and 5 volts.

A shift register 13 is connected to output terminals 12$c$ and 12$d$ of the waveform reshaping circuit 12. According to the arrangement between the device and the main apparatus, the output from the terminal 12$c$ is predetermined to be data signals to the shift register 13 and the output from the output terminal 12$d$ is predetermined to be clock signals for shifting the data signals into shift register 13. Parallel output terminals 13$a$ through 13$k$ of the shift register 13 are arranged so that as the shift register is loaded, the first data generated from the output terminal 12$c$ is generated at the output terminal 13$a$ and the last data from the output terminal 12$c$ is generated at the output terminal 13$k$.

A CMOS IC memory chip 14 provides data storage. Addressing for reading and writing purposes is applied through terminals $A_0$ to $A_9$. A chip select terminal CS and a write enable terminal WE can be activated to store data appearing at a terminal $D_{in}$. The contents of an addressed location can be output via a terminal $D_{out}$.

A driver 15 for the light emitting unit 16 is connected to terminal $D_{out}$. The light emitting unit 16 comprises a light-emitting diode which is turned on or off by a transistor (not shown) of the driver 15 in accordance with the state of the terminal $D_{out}$. In this embodiment, the light-emitting diode emits light when the level of the terminal $D_{out}$ is high (5 V).

Referring to FIGS. 2 and 3, power terminals 9a and 9b are connected to electrodes 2 and 3 respectively. A standby battery 17 is connected in series with a diode 18 across terminals 9a and 9b. When the power supply connected to the electrodes 2 and 3 is broken, standby battery 17 acts as a storage holding back-up power supply for IC memory 14. Diode 18 prevents the flow of current to the standby battery 17 when the power supply is provided to the terminals 9a and 9b.

Referring to FIG. 3, the necessary power for all of the blocks on the printed circuit board 9 except for IC memory 14 is provided from a connection designated as Ⓐ. No power is provided to any of the blocks except for IC memory 14 when the connection of the external power supply to electrodes 2 and 3 is interrupted. The ground wiring (not shown) is common to all of the blocks.

A diode 19 assures that no voltage will be applied by standby battery 17 to the electrode 2 when the IC memory 14 is powered solely by the standby battery 17.

Referring to FIG. 4, a schematic diagram of the light sensing unit 11 and the waveform reshaping circuit 12 is shown.

Referring to FIGS. 5(a)-5(d) a timing chart of an operation which writes data into the IC memory 14 is shown. Referring to FIGS. 6(a)-6(e), a timing chart of an operation which reads data from the IC memory 14 is shown. Referring to FIGS. 5(a)-5(d) and 6(a)-6(e), numerals 12a, 12b, 12c and 12d designate the output terminals of the waveform reshaping circuit 12.

Referring to FIGS. 3, 4, 5(a)-5(d) and 6(a)-6(e), the operation of the device will be described in detail.

When an external power supply is connected to electrodes 3 and 4 and thus to terminals 9a and 9b, a voltage of +5 V is supplied to the IC memory 14 via the diode 19 and to the other components from connection Ⓐ. All of the components of printed circuit board 9 operable.

Standby battery 17 (comprising a mercury cell is this embodiment) places a voltage of about 4 V on the anode side of the diode 18. The voltage is lower than the external voltage so as to prevent current from flowing out of standby battery 17. The flow of current into the battery 17 is prevented by the diode 18.

Referring to FIG. 4, when an incident light falls on one of phototransistors $Q_1$ to $Q_4$ of the light sensing unit 11, the phototransistor turns on, causing the noninverting input of the corresponding operational amplifier $Q_5$ to $Q_8$ to rise from zero volts to $V_1$ volts.

The inverting input of each of the operational amplifiers $Q_5$–$Q_8$ are preset to $V_2$ volts by a voltage divider comprising two resistors 20 and 21. When $Q_1$ is off, $V_1$ $V_2$. The phototransistor output is divided by two resistors 22 and 23 so that $V_1 > V_2$ when $Q_1$ is on. The output of operational amplifier $Q_5$ goes high when there is an incident light on $Q_1$.

Phototransistors $Q_1$ to $Q_4$ are arranged with respect to the main apparatus such that the phototransistor $Q_1$ corresponds to the chip select signal (CS) and the phototransistor $Q_2$ corresponds to the write enable signal (WE) for the IC memory 14. When there is an incident light on both $Q_1$ and $Q_2$, the IC memory 14 is selected and the write mode is selected.

In like manner, phototransistor $Q_3$ corresponds to the input data to the shift register 13 and the phototransistor $Q_4$ corresponds to clock pulses to shift data into shift register 13. Thus, by switching on and off the incident light with a suitable timing, it is possible to send any desired data.

FIGS. 5(a)-5(d) and 6(a)-6(e) show these operations in the form of timing charts. The operation of the device will be described first in connection with the writing of data into the IC memory 14. It is assumed that the high logic level of the timing charts corresponds to a condition where there is an incident light, whereas the low logic level corresponds to a condition where the incident light is cut off. The write operation is started at a time $T_0$ when a bit of address information ($A_0$) is input to the shift register 13 through phototransistor $Q_3$. At the same time that address information $A_0$ is input, a shift clock signal input though phototransistor $Q_4$. The shift register 13 is latched and shifted by the positive-going edge of the shift clock signal. Thus, by the above operations, on bit of address information is input to memory device M.

In the present embodiment, the IC memory 14 has a 1,024 bits × 1 word configuration so that an address is 10 bits long. As a result, 10 successive operations are effected by the phototransistors $Q_3$ and $Q_4$ to introduce the memory address of the data to be written. One bit of data is input after the 10 bits of address information. After 10 bits of address and one bit of data has been stored in shift register 13, a write to IC memory 14 can be initiated.

A selection signal for the IC memory 14 is input through phototransistor $Q_1$ so that chip select line 12a goes high. A write enable signal is input through phototransistor $Q_2$ to cause terminal 12b to go high. The data specified by the DATA bit is stored in the location of IC memory 14 specified by the address information placed data at terminals $A_0$ to $A_9$.

The addressing for reading data from IC memory 14 is accomplished by first transferring address data to shift register 13 by same technique as is used for the write operation. In the read operation, however, the value of the DATA bit may be anything because it is ignored. The read mode of the IC memory 14 is selected by making the signal CS go high. The contents of the location of IC memory 14 corresponding to the address stored in shift register 13 is output at the terminal $D_{out}$. When the terminal $D_{out}$ is high, the light-emitting diode of the light emitting unit 16 emits light and the light is read by the external main apparatus. Thus, the contents of the IC memory 14 can be read.

By following the above-mentioned operations, data can be written into and read from the IC memory 14. Further, if the external power source is disconnected, which happens when memory device M is carried by a person, a voltage is supplied to the IC memory 14 from the standby battery 17 to prevent the contents of the IC memory 14 from being erased.

Further, while, in the above-described embodiment, the desired information is transmitted by means of light beams, the same result can be easily realized by using an ultrasonic transmitter and receiver.

Further, instead of using the IC memory 14, a single-chip microcomputer of the type which has come into wide use recently may be incorporated so that the invention can be applied not only to a simple portable memory device but also to a portable memory device including a control unit.

We claim:

1. A portable memory device for receiving power from an external means and for transmitting and receiving various signals to and from the external means, said device comprising:

semiconductor memory means which can be written into and read from for storing data signals;

a converting circuit including nonconductive connector means for receiving write and read control signals and for receiving and transmitting data and for receiving address information in the form of nonconductive signals, and converting means for converting said nonconductive signals into electric signals and vice versa;

shift register means for effecting serial-to-parallel conversion of address signals and data between said converting circuit and said semiconductor memory means;

power circuit means for supplying power to said semiconductor memory means, said converting circuit, and said shift register;

conductive connector means for selectively providing power from said external means to said power circuit means;

a standby battery for providing a backup power supply for said semiconductor memory means when said conductor connector means is not providing power to said power circuit means;

diode means for preventing current from being supplied from said standby battery to said converting circuit and said shift register; and a case accommodating said conductive connector means, said semiconductor memory means, said standby battery, said converting circuit, said shift register means, said power circuit means, and said diode means.

2. A memory device according to claim 1, wherein said nonconductive connector means includes phototransistors and a light-emitting diode.

3. A memory device according to claim 2, wherein said converting circuit includes a waveform reshaping circuit for converting electrical signals generated from said phototransistors in response to light signals to electrical logical signals and applying the same to said shift register means, and a driver for driving said light-emitting diode in response to electrical logical signals from said semiconductor memory means.

4. A memory device according to claim 3, wherein input signals applied to said memory device include a semiconductor memory read/write selection signal, a clock signal and a signal of one bit indicative of address and data information, and wherein said shift register means receives clock signals and the 1-bit signals supplied from said converting circuit in response to input signals so as to sequentially shift and store said 1-bit signals in response to said clock signals, whereby when writing data into said semiconductor memory means, an address information having a predetermined number of bits and data are stored in said shift register means so that said semiconductor memory means is addressed in accordance with said stored address information and said data stored in said shift register means is written into said semiconductor memory means, and when reading out data from said semiconductor memory means, said semiconductor memory means is addressed in accordance with an address information stored in said shift register means so that data stored in said semiconductor memory means in a location specified by said address information is read out in the form of electrical logic signals and said driver is actuated by said electrical logic signals, thereby driving said light-emitting diode.

5. A memory device as in claim 1 wherein the size and weight of said case enables easy transportation by a person.

* * * * *